(12) United States Patent
Monchoix et al.

(10) Patent No.: US 8,574,418 B2
(45) Date of Patent: Nov. 5, 2013

(54) ELECTROPLATING METHOD FOR COATING A SUBSTRATE SURFACE WITH A METAL

(75) Inventors: Hervé Monchoix, Saint Isnier (FR); Frédéric Raynal, Paris (FR); Jérôme Daviot, Leuven (BE); José Gonzalez, Paris (FR)

(73) Assignee: Alchimer, Massy (FR)

( * ) Notice: Subject to any disclaimer, the term of this patent is extended or adjusted under 35 U.S.C. 154(b) by 744 days.

(21) Appl. No.: 11/992,372

(22) PCT Filed: Sep. 20, 2006

(86) PCT No.: PCT/FR2006/050915
§ 371 (c)(1),
(2), (4) Date: Nov. 6, 2009

(87) PCT Pub. No.: WO2007/034117
PCT Pub. Date: Mar. 29, 2007

(65) Prior Publication Data
US 2010/0038256 A1      Feb. 18, 2010

Related U.S. Application Data

(63) Continuation-in-part of application No. 11/266,798, filed on Nov. 4, 2005, now abandoned.

(30) Foreign Application Priority Data

Sep. 20, 2005   (FR) ...................................... 05 09572

(51) Int. Cl.
| | |
|---|---|
| *C25D 3/38* | (2006.01) |
| *C25D 5/02* | (2006.01) |
| *C25D 5/18* | (2006.01) |
| *C25D 7/12* | (2006.01) |
| *C25D 11/32* | (2006.01) |
| *H01L 21/288* | (2006.01) |
| *H01L 21/445* | (2006.01) |

(52) U.S. Cl.
USPC ............ 205/104; 205/123; 205/157; 205/296

(58) Field of Classification Search
USPC .................................. 205/104, 157, 296, 123
See application file for complete search history.

(56) References Cited

U.S. PATENT DOCUMENTS

| | | | |
|---|---|---|---|
| 5,302,278 | A | 4/1994 | Nobel et al. |
| 5,969,422 | A | 10/1999 | Ting et al. |

(Continued)

FOREIGN PATENT DOCUMENTS

| | | |
|---|---|---|
| EP | 0 611 840 A1 | 8/1994 |
| JP | 01-219187 A | 9/1989 |

(Continued)

OTHER PUBLICATIONS

Van Horn, "Pulse Plating", Dynatronix, Aug. 5, 1999, pp. 1-13.*

(Continued)

*Primary Examiner* — Edna Wong
(74) *Attorney, Agent, or Firm* — Hamre, Schumann, Mueller & Larson, P.C.

(57) ABSTRACT

The object of the present invention is a method of coating a surface of a substrate with copper by electroplating. According to the invention, this method comprises: a step during which the surface to be coated is brought into contact with an electroplating bath while the surface is not under electrical bias; a step of forming the coating during which the surface is biased; a step during which the surface is separated from the electroplating bath while it is under electrical bias; the aforementioned electroplating bath comprising, in solution in a solvent: a source of copper ions, with a concentration of between 0.4 and 40mM; and at least one copper complexing agent.

32 Claims, 2 Drawing Sheets

(56) References Cited

U.S. PATENT DOCUMENTS

| | | | |
|---|---|---|---|
| 6,123,825 A * | 9/2000 | Uzoh et al. | 205/183 |
| 6,309,969 B1 | 10/2001 | Oskam et al. | |
| 6,323,121 B1 | 11/2001 | Liu et al. | |
| 6,409,903 B1 | 6/2002 | Chung et al. | |
| 6,551,484 B2 | 4/2003 | Hey et al. | |
| 6,806,186 B2 | 10/2004 | Chen et al. | |
| 6,811,675 B2 | 11/2004 | Chen | |
| 6,893,550 B2 | 5/2005 | Dubin et al. | |
| 6,897,152 B2 | 5/2005 | Verbunt | |
| 2001/0042689 A1 | 11/2001 | Chen | |
| 2003/0155247 A1 | 8/2003 | Miura et al. | |
| 2004/0016637 A1 * | 1/2004 | Yang et al. | 204/242 |
| 2004/0206628 A1 * | 10/2004 | Lubomirsky et al. | 205/137 |
| 2005/0006245 A1 * | 1/2005 | Sun et al. | 205/291 |
| 2005/0199502 A1 | 9/2005 | Andricacos et al. | |
| 2005/0274622 A1 * | 12/2005 | Sun et al. | 205/209 |
| 2006/0065537 A1 * | 3/2006 | Barstad et al. | 205/291 |
| 2007/0062817 A1 | 3/2007 | Monchoix et al. | |
| 2007/0062818 A1 | 3/2007 | Daviot et al. | |

FOREIGN PATENT DOCUMENTS

| | | | |
|---|---|---|---|
| JP | 2002-180259 A | | 6/2002 |
| JP | 2002180259 A | * | 6/2002 |

OTHER PUBLICATIONS

Rosenberg et al., "Copper Metallization for High Performance Silicon Technology," Ann. Rev. Mater. Sci (2000), 30, pp. 229-262.

"Handbook of chemistry and physics—84$^{th}$ edition", David R. Lide, CRC Press.

Chen et al., "ECD Seed Layer for Inlaid Cooper Metallisation," Semiconductor Fabtech, 12$^{th}$ edition, Feb. 3, 2005, Abstract only.

Van Horn, "Pulse Plating," Dynatronix, Aug. 5, 1999, pp. 1-13.

\* cited by examiner

ELECTROPLATING METHOD FOR COATING A SUBSTRATE SURFACE WITH A METAL

This application is a continuation-in-part application of the application Ser. No. 11/266,798 filed Nov. 4, 2005 (now abandoned) and also a U.S. national stage application of the international application number PCT/FR2006/050915 filed Sep. 20, 2006.

BACKGROUND OF THE INVENTION

The present invention relates in general to a method of coating a surface of a substrate with a metal, and more particularly copper, by electroplating, in particular a surface consisting of an electrically resistive material.

The invention is especially applicable in the field of microelectronics for the fabrication of interconnects in integrated circuits. It is also applicable in other fields of electronics, for the fabrication of interconnects in printed circuits (called printed circuit boards or printed wire boards) or for the fabrication of passive elements, such as inductors, or in the electromechanical field in integrated circuits or in microsystems (called microelectromechanical systems).

The term "electroplating" is understood here to mean a method of covering a surface of a substrate with a metallic or organometallic coating, in which the substrate is electrically biased and brought into contact with a liquid that contains precursors of the said metallic or organometallic coating, so as to form the said coating. When the substrate is an electrical conductor, the electroplating is for example carried out by passing a current between the substrate to be coated which constitutes an electrode (the cathode in the case of a metallic or organometallic coating) and a second electrode (the anode) in a bath containing a source of precursors of the coating material (for example metal ions in the case of a metallic coating) and optionally various agents intended to improve the properties of the coating formed (uniformity and fineness of the deposit, resistivity, etc.), optionally with a reference electrode being present. By international convention, the current flowing through and the voltage applied to the substrate of interest, that is to say the cathode of the electrochemical circuit, are negative. Throughout this text, when these currents and voltages are mentioned with a positive value, it is implicit that this value represents the absolute value of the said current or the said voltage.

Copper electroplating is used in particular in the microelectronics field for the fabrication of interconnects in integrated circuits. The good electrical conductivity of copper and its high resistance to the phenomenon of electromigration, that is to say the low migration of copper atoms under the effect of the electric current density that can be responsible to significantly deform the conductor and be a major cause of failure, makes it in particular a material of choice for the fabrication of metal interconnects for integrated circuits of increasingly smaller etched features.

Integrated circuits are generally fabricated by forming active semiconductor devices, especially transistors, on the surface of silicon wafers, the said semiconductor devices being connected together by a system of metal interconnects consisting of "lines" and "contacts", also called "vias" placed in superimposed levels and obtained by respectively filling "trenches" and "wells" also called "interconnection holes", made in the dielectric layers.

Since copper is difficult to etch and has a high diffusivity in many materials, the interconnects are generally produced by a sequence of steps comprising:

deposition of an insulating dielectric layer;
etching of the interconnect features in the said dielectric layer;
deposition of a barrier layer (generally made of tantalum, titanium nitride, tantalum nitride, tungsten nitride or tungsten carbide, for example) used to prevent copper migration;
filling of the lines and interconnection holes with copper; and
removal of the excess copper by chemical mechanical polishing.

This sequence of steps is known by the name "Damascene process", which has been described for example by C. Y. Chang and S. M. Sze "ULSI Technology", McGraw-Hill, New York, (1996), pages 444-445.

The barrier layer generally has too high a resistance for copper to be electrochemically deposited homogeneously or uniformly at the wafer scale, an effect known to those skilled in the art by the term "ohmic drop". The high resistance of the barrier layer results both from the high resistivity of its constituent materials (generally metal nitrides) and from its small thickness (generally from a few nm to a few tens of nm, depending on the integrated circuit generation), which thickness is imposed by the small size of the interconnect features.

Consequently, it is generally necessary, prior to the copper electroplating step, to cover the barrier layer —using a non-electrochemical method—with a thin layer of metallic copper, called a seed layer. This seed layer, like the barrier layer, is currently produced by vapor phase deposition techniques such as PVD (physical vapor deposition) or CVD (chemical vapor deposition) deposition processes.

Owing to the critical dimensions of the lines and interconnection holes of current integrated circuits, and their trend towards ever smaller dimensions, the thickness of the copper seed layers at the present time is around 30 nm and should rapidly move towards 10 nm or less.

CVD deposition produces a conformal copper layer, that is to say one that accurately matches the topography of the surface to be coated, and does so for a wide range of aspect ratios. However, the adhesion to the diffusion barriers of the copper layers formed by chemical deposition is poor. This limits in practice the benefit of this type of process since as strong adhesion between the copper and the barrier is required in order to ensure reliability of the structures constituting the interconnects.

In addition, processes using chemical vapor deposition are relatively expensive because of the high cost of the consumables (the precursors), of the equipment needed to implement them and their low efficiency.

PVD deposition is presently preferred from the industrial standpoint because it allows surfaces having a high resistance to be coated with better adhesion of the copper to the barrier than obtained with CVD processes.

The thickness of the coating deposited by PVD is directly proportional to the solid angle seen from the surface to be coated. Consequently, those portions of the surface having salient angles are covered with a thicker layer than those portions of the surface having re-entrant angles. As a result, the copper seed layers formed by physical vapor deposition are not conformal, and therefore do not have a uniform thickness at every point on the surface of the substrate. In particular, shadow or overhang effects are observed at the sharp edges of trenches or vias, up to the point of obstructing their apertures and then making it impossible to fill them. Moreover, the sidewalls of the trenches and vias may be covered with an insufficient thickness of the seed layer, which then results in imperfect subsequent filling, missing material or voids. In addition, the seed layer produced on the sidewalls of the features exhibits by nature an adhesion that differs from that deposited on the flat surface of the substrate (at the top and bottom of the trenches and vias). This may lead to inferior reliability properties, such as resistance to electromigration. In other words, the non-conformal coverage does not solely result in differences in thickness as lack of continuity and poor adhesion of the layer on the sidewalls of the trenches and vias may also arise therefrom.

These limitations make it very tricky to use PVD technology in advanced generation integrated circuits with very small dimensions of the trenches and vias (of the order of a few tens of nanometers) and very high aspect ratios.

In this context, the electroplating technique presented here constitutes an advantageous alternative to chemical vapor deposition or physical vapor deposition processes, and to the more conventional metal electroplating techniques, which cannot be implemented on resistive substrates.

This is because conventional electroplating, which consists in applying in general a DC current to the substrate immersed in a bath containing metal ions, can be applied only to surfaces that are sufficiently conducting, that is to say typically having a sheet resistance of less than about a few ohms/square, which is not the case for the layers forming a copper diffusion barrier in the most advanced technologies, the sheet resistance of which is commonly a few tens of ohms/square to several hundred ohms/square and may be several tens of thousands of ohms/square.

Sheet resistance is a quantity used by those skilled in the art for measuring electrical resistance of thin films or layers. It is expressed in ohms/square and is equivalent to the resistivity for a two-dimensional system, that is to say one in which the current flows in the plane of the layer and not in a plane perpendicular to this layer. Mathematically, the value of the sheet resistance is obtained by dividing the resistivity (expressed in ohms·m or microohms·cm) of the constituent material of the layer by the thickness (expressed in m or nm) of this layer.

At the present time, conventional copper electroplating is mainly used for filling the trenches and wells in the damascene process by applying a DC current to a wafer covered beforehand with a seed layer and immersed in an acid copper sulphate bath containing additives. This process for filling the trenches and wells with metallic copper is described for example by Rosenberg et al., in "Copper metallization for high performance silicon technology", Ann. Rev. Mater. Sci (2000), 30, 229-62.

The use of copper electroplating on a copper seed layer for filling trenches and wells has also been described in U.S. Pat. No. 6,893,550 incorporated herein by reference.

The electroplating method described in document U.S. Pat. No. 6,893,550 is essentially characterized:
  on the one hand, in that it makes use of an electroplating bath whose specific chemical composition comprises at least one acid, preferably sulphuric acid, at least one halide ion, preferably chloride, and a combination of chemical agents capable of accelerating or suppressing formation of the coating; and
  on the other hand, in that it consists in modifying the density of the current applied in predetermined sequences.

Copper electroplating has also been recommended, for example in U.S. Pat. No. 6,811,675, for filling any voids in the seed layer (seed enhancement) or for repairing this layer (seed repair).

In a preferred embodiment described in this prior document, a first step is carried out, preferably by a physical vapor deposition process, in which a non-uniform "ultrathin" (thickness of about 20 nm) copper seed layer is deposited and then in a second step the conformality of the layer is improved by electroplating using an alkaline electroplating solution (the pH of which is greater than 9) containing copper sulphate, a copper complexing agent, preferably citric acid, and optionally boric acid in order to improve the brightness of the coating and/or ammonium sulphate for reducing the resistivity of the coating. The DC current density applied during electroplating is between 1 mA/cm$^2$ and 5 mA/cm$^2$.

It is indicated in the above prior document that this electroplating process may also be used to produce a copper seed layer directly, but this possibility is not illustrated by any example and it appears not to be easily achievable owing to the high current densities mentioned in that document.

SUMMARY OF THE INVENTION

In this situation, the object of the present invention is to solve a new technical problem, namely of how to provide a method of coating a surface of a substrate by electroplating with a metal which makes it possible in particular to produce continuous and conformal copper seed layers having a thickness of the order of 10 nm or less and exhibiting excellent adhesion to diffusion barrier surfaces that may have a high surface resistance of up to a few megohms/square.

It has been discovered, and it is this that constitutes the basis of the present invention, that it is possible to solve this technical problem in a relatively simple manner, which can be used on an industrial scale, by using a specific electroplating bath and by controlling the conditions under which the surface to be coated is brought into contact with the electroplating bath prior to the formation of the coating and the conditions under which this surface is separated from the said bath after the coating has been formed.

Thus, the object of the present invention is in general a method of coating a surface of a substrate with copper by electroplating, characterized in that it comprises:
  a step referred to as "cold entry" during which the said surface to be coated is brought into contact with an electroplating bath while the said surface is not under electrical bias;
  a step of forming the coating during which the said surface is biased for a time long enough to form the said coating;
  a step referred to as "hot exit" during which the said surface is separated from the electroplating bath while it is still under electrical bias;
and in that the aforementioned electroplating bath comprises, in solution in a solvent:
  a source of copper ions, with a concentration of between 0.4 and 40 mM, preferably of between 0.4 and 18 mM and more preferably of between 0.4 and 15 mM; and
  at least one copper complexing agent chosen from the group comprising primary aliphatic amines, secondary aliphatic amines, tertiary aliphatic amines, aromatic amines, nitrogen heterocycles, and oximes.

DETAILED DESCRIPTION

Figure 1A:
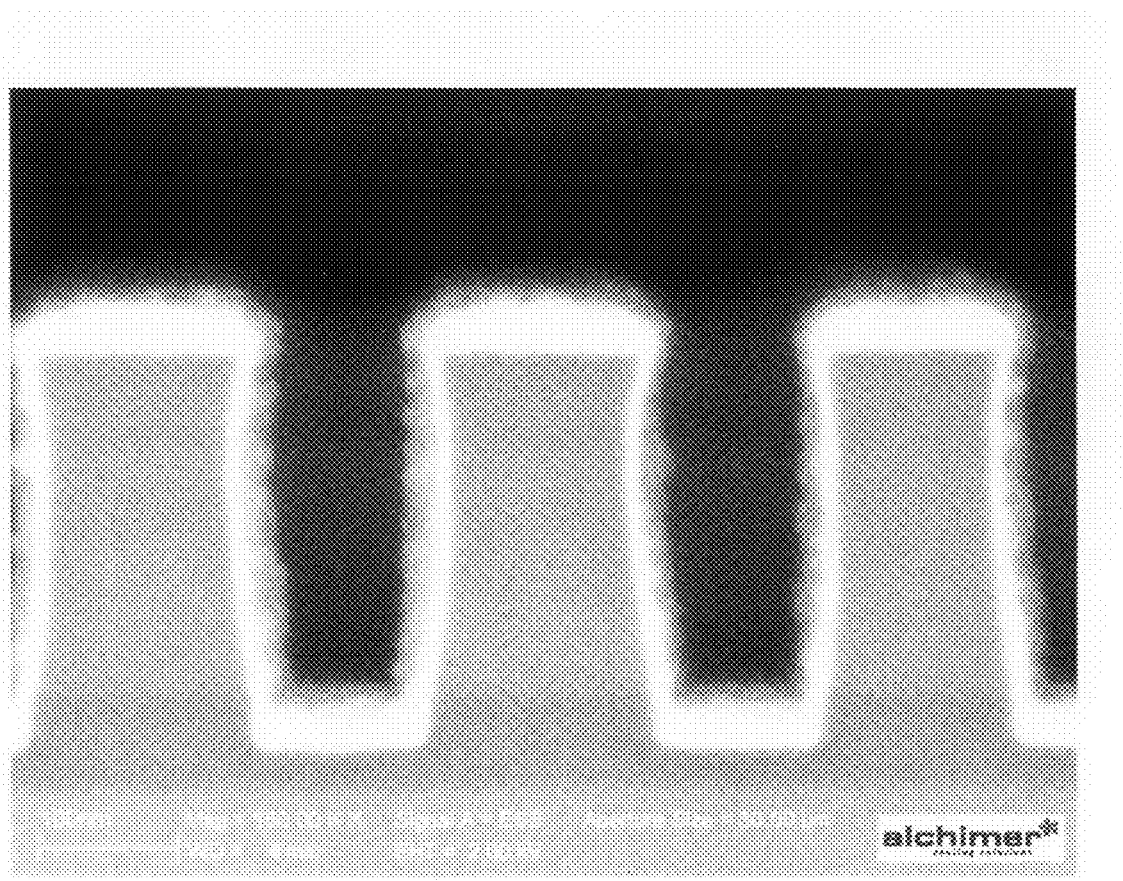
FIGS. 1A-B are cross-sectional micrographs showing copper layers formed in accordance with Example 4.

It has been observed, quite unexpectedly, that it is possible, with the aforementioned electroplating baths, to improve the adherence between the copper coating layer produced by electroplating and the barrier layer by bringing the surface to be coated into contact with the electroplating bath without being under electrical bias, that is to say without imposing an electric current or electric potential relative to a counterelectrode or relative to a reference electrode on this surface, prior to the electroplating step.

An even more substantial improvement in this adherence has been observed when the surface of the substrate to be coated is kept in contact with the electroplating bath for a period of at least 5 seconds after this contacting step and still prior to the electroplating step.

It has also been observed, surprisingly, that it is possible to obtain a seed layer having a conductivity compatible with electroplating filling methods, while keeping the coated surface under electrical bias, preferably for a time of between 1 and 10 seconds, after its removal from the electroplating bath.

It is therefore the "cold entry" and "hot exit" steps that constitute the essential characteristic steps of the method according to the present invention.

The step of forming the copper coating is carried out in a relatively conventional manner, but it has been observed that, unlike the processes described in the prior art and especially in U.S. Pat. No. 6,811,675, the level of current needed to form the coating is much lower (at least five times lower than the mean value mentioned in this prior patent, and in any case outside the process windows mentioned therein).

"Hot entry", that is to say entry under bias, is the standard practice in processes for electrochemically depositing copper for filling trenches and wells. This is because, since the electroplating solution is generally acidic, it is likely to cause etching of the seed layer and consequently electroplating is prevented, something which must be avoided.

During the "cold entry" step of the method according to the invention, the surface of the substrate to be coated is preferably kept in contact with the electroplating bath for a period of at least 5 seconds.

It has been observed that by adjusting this parameter during the fabrication of just the seed layer it is possible, surprisingly, to improve the adhesion of the "seed layer/fill layer or thick copper or thick layer" assembly, that is to say the "operational" adhesion of the assembly for which the seed layer is produced. Specifically, even though it is in general difficult for the adhesion of a single seed layer to be measured directly, especially owing to its small thickness, it is observed that the adhesion of the seed layers produced according to the present invention is obviously very high. However, it is after production of a thick copper layer (with a thickness of about 500 nm to 1 micron, or more) that it is easier and more useful to determine the energy of adhesion of the "seed layer/fill layer or thick copper or thick layer" assembly to the barrier layer, which energy is the operational property of interest that is actually to be optimized. For example, this adhesion may be determined by peeling an adhesive tape bonded to the upper surface of the assembly, for example by using a pulling test system. The adhesion measured in this way, or interfacial energy expressed in $J/m^2$, characterizes overall both the adherence of the seed layer to the barrier and that of the thick copper layer to the seed layer. It does not given precise information about one or the other interface, but it does allow the desired operational property to be quantified, namely the strength of the copper/barrier interface. In what follows, the expressions "adhesion of the seed layer", "adhesion of the thick copper layer to the seed layer" and "the strength of the copper/barrier interface after filling" will thus be used interchangeably.

It has also been observed that if the duration of the "cold" entry step is less than 5 seconds, the adhesion of the copper layer to the substrate, although improved compared with entry under bias, may remain insufficient in certain cases, especially those requiring the deposition of a copper seed layer in direct contact with a barrier layer of an integrated circuit interconnect.

On the other hand, if the duration of this step is 5 seconds or longer, preferably between 10 and 60 seconds and more preferably about 10 to 30 seconds, the interfacial energy measured by the peel force is substantially equal to, or even greater than that obtained by sputtering processes (greater than 10 $J/m^2$).

There is no particular limit regarding the maximum duration of this step, but under the experimental conditions employed, no significant improvement in the adhesion is observed for a time of longer than about 60 seconds.

During the "hot exit" step of the method according to the invention, the substrate surface coated with the copper is removed from the electroplating bath while under electrical bias preferably for a period of between 1 and 10 seconds, more preferably for a period of about 1 to 5 seconds.

It has been observed in this case that a "cold exit", that is to say exit while not under bias (that is to say again when the electrical bias of the substrate is interrupted before the said substrate is removed from the electroplating bath), the resistance of the copper coating remains very close to that of the barrier layer, even though it is sometimes possible to deposit a thick filling copper on such a coating with conventional electrochemical means.

In contrast, it has been observed, unexpectedly, that a "hot exit" results in an extremely thin (10 nm) seed layer having an electrical conductivity sufficient to allow the next step of filling with copper by electrochemical deposition using processes known to those skilled in the art.

Advantageously, the "hot exit" step is carried out in potentiostatic mode, that is to say by keeping the electric potential of the wafer at a fixed value, this potential being measured either relative to the counterelectrode of the circuit or relative to a reference electrode, preferably at the same voltage level as during the coating deposition step when this is also carried out in potentiostatic mode.

The combination of "cold entry" and "hot exit" steps in the method according to the invention makes it possible to achieve better adhesion of the "seed layer/copper filling" assembly more easily and reproducibly.

The step of forming the coating by electroplating is carried out for a duration sufficient to form the desired coating. This duration may be easily determined by a person skilled in the art, the growth of the film being a function of the charge, which is equal to the time integral of the electric current flowing in the circuit over the deposition time (Faraday's law).

During the step of forming the coating, the surface to be coated is biased, either in galvanostatic mode (with a fixed set current) or in potentiostatic mode (with a fixed set potential, optionally relative to a reference electrode) or else in pulsed mode (either the current or the voltage being pulsed).

It is also possible to combine these steps, for example a step in potentiostatic mode followed by a step in galvanostatic mode.

In general, a satisfactory coating can be obtained by biasing in galvanostatic mode preferably within the current range from 0.1 $mA/cm^2$ (milliamps per square centimeter) to 5 $mA/cm^2$, and more particularly from 0.1 $mA/cm^2$ to 1 $mA/cm^2$.

A satisfactory coating may also be obtained by biasing in potentiostatic mode, by imposing a cell voltage in such a way that the resulting cell current lies within the same current range as indicated previously. Although the cell voltage depends in particular on cell design parameters, such as the distance from the counterelectrode or the presence of a membrane, it will be easy for a person skilled in the art to determine the cell voltage by measuring and adjusting the current obtained for a given potential and a given configuration.

A satisfactory coating may also be obtained by biasing in pulsed mode, preferably so as to impose voltage pulses.

In general, this step may be carried out so as to impose voltage pulses corresponding to a maximum current per unit area within the range from 0.1 mA/cm$^2$ to 5 mA/cm$^2$, and more particularly from 0.1 mA/cm$^2$ to 1 mA/cm$^2$, and to a minimum current per unit area within the range from 0 mA/cm$^2$ to 0.5 mA/cm$^2$, and more particularly from 0 mA/cm$^2$ to 0.1 mA/cm$^2$.

According to one particular feature, the duration of bias at the maximum voltage may be between 0.15 and 5 seconds, for example around 2 seconds for a voltage corresponding to a maximum current per unit area of around 0.5 mA/cm$^2$, whereas the duration of bias at the minimum voltage may be between 0.15 and 7 seconds, for example around 3 seconds, for a voltage corresponding to a minimum current per unit area of around 0.05 mA/cm$^2$.

The number of cycles to be performed during this step depends on the desired thickness of the coating.

In general, a person skilled in the art will readily determine the number of cycles to be performed knowing that, under the aforementioned general conditions, illustrated by the examples below, it has been observed that the deposition rate is about 0.1 nm per cycle.

The latter method of implementing the invention has been used in particular to produce copper seed layers on highly resistive substrates, the sheet resistance of which may be up to 100 000 ohms/square, or even a few megohms/square.

The electroplating bath (or composition) used in the method according to the present invention comprises, in solution in a solvent, a source of copper ions and at least one specific copper complexing agent, preferably in a particular copper/complexing agent(s) molar ratio, and more preferably this bath must have a pH of less than 7.

In particular, excellent results have been obtained when, in the electroplating bath:
 the copper/complexing agent(s) molar ratio is between 0.1 and 2.5, preferably between 0.3 and 1.3; and
 the pH of the said composition is less than 7, preferably between 3.5 and 6.5.

Although in principle there is no restriction on the nature of the solvent (provided that it dissolves the active species of the solution sufficiently and does not interfere with the electroplating), water or a hydroalcoholic solution will be preferred.

The copper complexing agents that can be used within the context of the present invention may be chosen from:
 primary aliphatic amines, in particular ethylamine, cyclohexylamine, ethylenediamine and cyclohexanediamine;
 secondary aliphatic amines, in particular pyrrolidine;
 tertiary aliphatic amines, in particular hydroxyethyldiethylamine and tetraethylenepentamine;
 aromatic amines, in particular 1,2-diaminobenzene and 3,5-dimethylaniline;
 nitrogen heterocycles, in particular pyridine, 2,2'-bipyridine, 8-hydroxyquinoline sulphonate, 1,10-phenanthroline, 3,5-dimethylpyridine and 2,2'-bipyrimidine; and
 oximes, in particular dimethylglyoxime.

In general, the nitrogen heterocycles that constitute one of the preferred classes of complexing agents that can be used within the context of the present invention may be defined as monocyclic or polycyclic compounds, whether fused or not, having 1 to 8 nitrogen atoms, each ring of which contains 5 to 6 members and may or may not be substituted with 1 to 8 atoms or groups of atoms chosen from halogens, hydroxyl and alkyl groups having from 1 to 6 carbon atoms.

The electroplating composition may include one or more complexing agents.

It has been found that excellent results can be obtained with complexing agents capable of being adsorbed on a metal surface, resulting in ordered layers. Such agents, which constitute the copper complexing agents currently preferred according to the invention, are especially pyridine, 2,2'-bipyridine and the mixtures thereof, in particular mixtures in which the molar ratio between pyridine and 2,2'-bipyridine lies between 5:1 and 1:5, preferably between 3:1 and 1:1 and more preferably about 2:1.

In general, the electroplating composition includes a source of copper ions, in particular cupric ($Cu^{2+}$) ions. Advantageously, the aforementioned source of copper ions is a copper salt such as in particular copper sulphate, copper chloride, copper nitrate or copper acetate, preferably copper sulphate.

According to one particular feature, the source of copper ions is present within the electroplating composition with a concentration of between 0.4 and 40 mM, preferably of between 0.4 and 18 mM and more preferably of between 0.4 and 15 mM.

Excellent results have been obtained with compositions in which the source of copper ions is present with a concentration of between 0.5 and 4 mM.

According to a preferred method of implementation, the copper ion source/copper complexing agent(s) molar ratio in the electroplating composition used in the method according to the invention is between 0.1 and 2.5, preferably between 0.3 and 1.3.

In general, this electroplating composition advantageously has a pH of less than 7, preferably between 3.5 and 6.5.

The pH of the composition may optionally be adjusted within the aforementioned pH by means of a buffer, such as one of those described in "Handbook of Chemistry and Physics", 84th edition, David R. Lide, CRC Press.

A currently preferred electroplating composition comprises, in aqueous solution:
 copper sulphate, with a concentration of between 0.4 and 40 mM, preferably of between 0.4 and 18 mM and more preferably of between 0.4 and 15 mM;
 a mixture of pyridine and 2,2'-bipyridine as copper complexing agents;
 the copper/copper complexing agents molar ratio being between 0.3 and 1.3; and
 the pH of the said composition being less than 7, preferably between 3.5 and 6.5.

The process according to the present invention is particularly useful for preparing a copper seed layer having a very low thickness, for instance of the order of 10 nm or less, on a surface forming a barrier layer preventing copper diffusion.

According to a particular embodiment, the barrier layer preventing copper diffusion comprises at least one material chosen among tantalum nitride, tantalum, ruthenium, cobalt, tungsten, titanium nitride, examples of specific barrier surfaces being ones consisting of a tantalum nitride/tantalum bilayer or a ruthenium layer.

The present invention will now be illustrated by the following non-limiting examples in which the method according to the invention is used to deposit a copper seed layer on silicon substrates coated with a copper diffusion barrier layer. This method is especially applicable in the fabrication of copper interconnect structures for integrated circuits.

EXAMPLE 1

Deposition of a Copper Seed Layer on a TaN/Ta Barrier Layer According to a First Method of Implementing the Invention A. Apparatus and Equipment Substrate:

The substrate used in this example consisted of a 200 mm diameter silicon wafer covered with a silica layer having a thickness of 400 nm, itself coated with a tantalum nitride (TaN) layer having a thickness of 15 nm deposited by reactive sputtering and with a tantalum (Ta) layer having a thickness of 10 nm, also deposited by sputtering.

This TaN/Ta "bilayer" constitutes a copper diffusion barrier as used in "double damascene" structures in the fabrication of copper interconnects for integrated circuits.

Electroplating Solution:

The electroplating solution used in this example was an aqueous solution containing: 0.3 g/l (or 1.7 mM) of 2,2'-bipyridine; 0.6 g/l (or 2.4 mM) of $CuSO_4.5H_2O$; and 0.3 ml/l (or 3.3 mM) of pyridine, the pH of the solution being around 6.

Equipment:

In this example, an electroplating deposition equipment representative of that employed in the microelectronics industry, model EquinoX™ from Semitool®, capable of processing 200 mm wafers was used.

This equipment comprised an electroplating deposition cell in which the seed layer was deposited and a rinse/dry station was used after deposition.

The electroplating deposition cell comprised an anode, made either of an inert metal (for example platinum-coated titanium) or of a metal identical to that constituting the seed layer, in this case copper, the silicon wafer coated with the TaN/Ta barrier layer constituting the cathode of this cell.

This cell also included a stabilized power supply for delivering up to 30 V and 4 A and a device for electrically contacting the cathode, physically isolated from the solution by a seal. This electrical contacting device generally had a ring shape and allowed the substrate to be biased at various contact points placed uniformly around the said substrate.

It also included a device for supporting the wafer to be coated, including means for rotating the said wafer at a predetermined speed.

B. Experimental Protocol

The method according to the invention comprised the following various consecutive steps.

Step 1: "Cold Entry"

This step was divided into two substeps:

1.1. The aforementioned substrate was introduced into the electroplating deposition cell so that the face having the TaN/Ta barrier layer came into contact with the electrical contacting device, the latter not yet being electrically powered.

1.2. The assembly formed by the electrical contacting device and the substrate, which hereafter will be referred as the "cathode assembly", was bought into contact, for example by immersion, with the electroplating solution. This contacting step, generally lasting 5 seconds or less (for example 2 seconds), was carried out while the device was still not electrically powered. According to one particular feature of the method according to the invention, the cathode assembly was then kept in the electroplating solution without being biased for a period of at least 5 seconds (for example around 30 seconds).

Step 2: Formation of the Copper Coating

The cathode assembly was then biased in potentiostatic mode by imposing a cell voltage corresponding to a current per unit area of generally between 0.4 $mA/cm^2$ and 0.8 $mA/cm^2$ (for example 0.6 $mA/cm^2$) and at the same time rotated at a speed of 20 to 60 rounds per minute (for example 40 rounds per minute).

The duration of this step depended, as will have been understood, on the targeted thickness of the seed layer. This duration can be easily determined by a person skilled in the art, the growth of the film depending on the charge passed in the circuit.

Under the aforementioned conditions, the deposition rate was about 1 nm per coulomb of charge passed in the circuit.

In this example, the duration of the electroplating step was around 50 seconds for obtaining a coating having a thickness of 10 nm, and around 200 seconds for obtaining a coating having a thickness of 40 nm.

Step 3: "Hot Exit"

This step may be divided into two substeps:

3.1. After the electroplating step, the copper-coated cathode assembly was withdrawn from the electroplating solution with a zero speed of rotation, while being maintained under voltage bias. The duration of this phase was about 2 seconds.

The speed of rotation was then increased to 500 rounds per minute for 10 seconds, the cathode assembly bias being cut off during this final phase.

A pre-rinse with deionized water was carried out in the cell.

3.2. The substrate coated with the seed layer was then transferred into the rinsing/drying module in order to be rinsed with deionized water.

The rinsing water was then removed, and then a drying operation under a stream of nitrogen was carried out.

The rotation was then stopped so as to allow the dried coated substrate to be removed.

In this example, the exit step, and in particular the removal of the cathode assembly from the electroplating solution, was carried out under voltage bias at the same level as during the step of forming the coating.

C. Results Obtained

By applying the experimental protocol described above, copper layers of 10 nm, 20 nm and 40 nm in thickness exhibiting excellent conformality, adhesion and resistance characteristics were obtained.

Conformality was assessed by observing scanning electron microscope cross sections and comparing the thickness of the seed layer on the horizontal surfaces with that on the vertical surfaces.

The sheet resistance was measured using a "4-point" measurement instrument well known to those skilled in the art.

The adhesion or interfacial energy was measured after electrochemical deposition of a 500 nm thick copper layer (plating layer or fill layer or thick copper or thick layer) on the seed layer. This measurement was carried out using an apparatus (pulling test system) that applied an increasing vertical pulling force on the surface via a strong adhesive tape until the copper layer (seed layer and plating layer) separates from the substrate. The work of this force (force multiplied by length of the layer that has delaminated) is equivalent to the energy that had to be supplied in order to separate the copper layer from its substrate. By dividing this energy by the area that has delaminated, the energy per unit area is obtained.

Some of the results of the measurements taken are given in Table 1 below.

EXAMPLE 2

Deposition of a Copper Seed Layer on a TaN Barrier Layer According to a Second Method of Implementing the Invention In this example, the method according to the present invention is used for depositing a copper seed layer on diffusion barriers having a high resistance.

A. Apparatus and Equipment

Substrate:

The substrate used in this example consisted of a 200 mm diameter silicon wafer coated with a silica layer having a thickness of 400 nm, itself coated with a tantalum nitride (TaN) layer having a thickness of 5 nm deposited by the ALD (atomic layer deposition) technique.

This TaN layer constituting a copper diffusion barrier as used in "double damascene" structures for the copper interconnects of integrated circuits had a surface resistance of around 3500 ohms/square.

This wafer was then cut into rectangular pieces 1.5 cm in width and 6 cm in length, called hereafter "samples".

Electroplating Solution:

The solution used in this example was an aqueous solution containing: 0.3 g/l (or 1.7 mM) of 2,2'-bipyridine; 0.6 g/l (or 2.4 mM) of $CuSO_4.5H_2O$; and 0.3 ml/l (or 3.3 mM) of pyridine, the pH of which was around 6.

Equipment:

For this example, a glass cell was used in which 100 ml of the aforementioned electroplating solution were introduced.

This cell was provided with a cover having two openings, opening into two enclosures in which, on the one hand, a sample holder and its electrical contacting device and, on the other hand, the anode formed from a platinum coated titanium part were fastened.

The electrical contacting device and the anode were connected to a potentiostat capable of delivering 20 V/2 A.

B. Experimental Protocol

The method according to the invention comprised the following various consecutive steps.

Step 1: "Cold Entry"

This step may be divided into two substeps:

1.1. Each specimen was introduced into the electroplating deposition cell so that the face having the TaN barrier layer came into contact with the electrical contacting device, the latter not yet being electrically powered.

1.2. The assembly formed by the electrical contacting device and the substrate, which hereafter will be referred as the "cathode assembly", was bought into contact, for example by immersion, with the electroplating solution. This contacting step, generally lasting 5 seconds or less (for example 2 seconds), was carried out while the device was still not electrically powered. According to one particular feature of the method according to the invention, the cathode assembly was then kept in the electroplating solution without being biased for a period of greater than 5 seconds (for example around 30 seconds).

Step 2: Formation of the Copper Coating

The cathode assembly was then voltage biased so as to impose voltage pulses on the cell, having a maximum of 8 V to 12 V (for example 10V) and a maximum between 0 V and 2 V (for example 1V).

The duration of biasing at 10 V was between 0.1 and 5 seconds (for example 2 seconds).

The duration of biasing at 1 V was between 0.15 and 7 seconds (for example 3 seconds).

In one specific example, each voltage application cycle therefore consisted of biasing for 2 seconds at 10 V followed by biasing for 3 seconds at 1 V.

Under these experimental conditions, the deposition rate was about 0.32 nm per cycle and 200 cycles were thus carried out in order to obtain a copper coating having a thickness of 65 nm.

Step 3: "Hot Exit"

The cathode assembly was then withdrawn vertically from the solution while still being under voltage bias of 10V.

Each specimen was then rinsed by hand with deionized water for 30 seconds and dried with an argon gun for 30 seconds.

C. Results Obtained

In the specific example defined above, a copper seed layer having a sheet resistance of 0.5 ohm/square was obtained.

A copper fill layer was electrochemically deposited on this layer.

The seed layer/fill layer assembly had an interfacial energy of around 6 $J/m^2$ measured by the technique described in example 1.

The aforementioned protocol was also employed with coupons obtained from silicon wafers coated with barrier layers having high resistivities varying between 200 microhms·cm and 50 000 microhms·cm (i.e. between 400 and 100 000 ohms/square).

Good results were obtained in terms of conformality, adhesion and resistance.

EXAMPLE 3

Deposition of a Copper Seed Layer on an Ru Barrier Layer According to a Third Method of Implementing the Invention In this example, the method according to the present invention was used to deposit a copper seed layer on a ruthenium-based diffusion barrier.

Substrate:

The substrate used in this example consisted of a silicon coupon 6 cm in length by 2 cm in width, coated with a silica layer having a thickness of 400 nm, itself coated with a ruthenium (Ru) layer having a thickness of 30 nm deposited by sputtering. The sheet resistance of this substrate was 7.5 ohms/square.

This Ru layer may constitute a copper diffusion barrier as used in "double damascene" structures in the fabrication of copper interconnects for advanced integrated circuits.

Solution:

The solution used in this example was identical to that of Example 1.

Equipment:

In this example, a glass electrolytic deposition cell made up of two parts was used, namely the cell intended to contain the electroplating solution, and a "cover" for maintaining the various electrodes in operative position.

The electrolytic deposition cell had three electrodes:

an inert metal (platinum) anode;
the silicon coupon coated with the TaN/Ta layer, constituting the cathode; and
an $Ag/AgClO_4$ reference electrode.

Connectors enabled the electrical contacting of the electrodes which were connected via electrical wires to a potentiostat delivering up to 10 V/2 A.

B. Experimental Protocol

The electroplating method used in this example was made up of the following various consecutive steps.

Step 1: "Cold Entry"

The electroplating solution was poured into the cell.

The various electrodes were placed on the cover of the electrolytic cell.

The electrodes were brought into contact with the electroplating solution. At this stage, the assembly thus formed was still not electrically biased (it was at its open-circuit potential).

The assembly was maintained in this state (i.e. under no electrical bias) for a period of 10 to 60 seconds (for example 30 seconds).

Step 2: Formation of the Copper Coating

The cathode was biased in galvanostatic mode within a current range from 2 mA (or 0.25 mA/cm$^2$) to 8 mA (or 1 mA/cm$^2$) (for example 6 mA (or 0.75 mA/cm$^2$)).

Degassing with argon may be employed—it allows some hydrodynamic regime to be established in the cell.

The duration of this step depended on the targeted thickness of the seed layer and could easily be determined by a person skilled in the art, the growth of the film being a function of the charge passed in the circuit.

Under the aforementioned conditions, the deposition rate was about 33 nm per coulomb of charge passed in the circuit.

In this example, the duration of the electroplating step was about 200 seconds in order to obtain a coating having a thickness of about 40 nm.

Step 3: "Hot Exit"

The cathode was then removed from the solution, the bias still being applied.

The cathode was then disconnected, and thoroughly rinsed with 18 MΩ deionized water, then dried using an argon gun with a gas pressure of around 2 bar.

C. Results Obtained

By applying the experimental protocol described above, a continuous conformal copper layer 40 nm in thickness was obtained (this being observed in a scanning electron microscope).

This copper seed layer had a sheet resistance of 2.5 ohms/square measured by the method described in Example 1.

EXAMPLE 4

Deposition of a Copper Seed Layer on a TaN/Ta Barrier Layer According to a Fourth Method of Implementing the Invention A. Apparatus and Equipment Substrate:

The substrate used in this example is identical to the one used in example 1.

Electroplating Solution:

The electroplating solution used in this example was an aqueous (de-ionized water 18.2 Mohm·cm) solution prepared in a cleanroom environment (class 10,000 or ISO 7) containing: 0.4 g/l (or 2.56 mM) of 2,2'-bipyridine (purity 99.7%) supplied by Oxkem; 0.8 g/l (or 3.2 mM) of CuSO$_4$.5H$_2$O (purity 99.995%) supplied by Alfa Aesar; and 0.367 ml/l (or 4 mM) of pyridine (purity 99.9%) supplied by Aldrich.

After preparation, the solution was filtered at 0.2 μm. The pH of the solution was between 5.94.

Equipment:

The equipment used in this example is identical to the one used in example 1.

B. Experimental Protocol

The electroplating method used in this example is identical to the one used in example 1.

C. Results Obtained

By applying the above experimental protocol, copper layers of 10 nm and 20 nm in thickness exhibiting excellent conformality, adhesion and resistance characteristics were obtained.

Figure 1B:
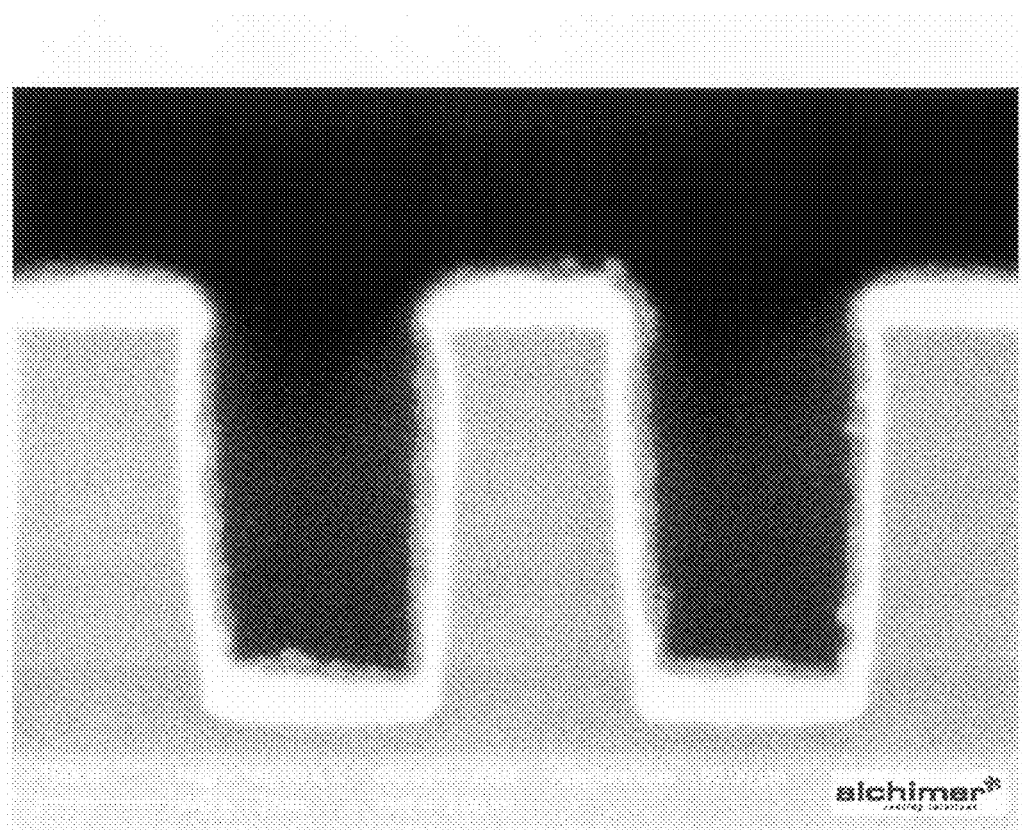

The excellent conformality characteristics of this layer are illustrated in FIGS. 1a and 1b which represent cross-sectional view in backscattered electrons mode enhancing chemical contrast.

Conformality over trenches was also characterized on a large scale (0.01 mm$^2$) using scatterometry. These measurements showed a copper layer thickness of 7 nm at the top, bottom and sidewalls of trenches and they are in good agreement with actual thicknesses observed by SEM cross-sections.

Except for scatterometry, all characterization methods are identical to the ones used in example 1.

Table 1 below gives some of the results obtained by implementing Examples 1 to 4 described above. More precisely, this table reports the sheet resistance and adhesion values (measured according to the protocols indicated in Example 1) obtained for copper seed layers of variable thicknesses. Similar trends were also observed for the sheet resistance before treatment of a few hundred ohms/square, or several tens of thousands of ohms/square or even up to a few megohms/square.

For comparison, this table also reports the sheet resistance and adhesion values obtained from the compositions specifically used within the context of the invention by applying a standard electroplating method comprising a "hot" entry and a "cold" exit.

TABLE 1

| Copper seed layer obtained according to: | Thickness (nm) | Sheet resistance (ohms/square) Before treatment | Sheet resistance (ohms/square) After treatment | Adhesion (J/m$^2$) |
|---|---|---|---|---|
| Comparative Example | 20 | 23 | 18 | 5 |
| Example 1 | 20 | 23 | 8 | 11-13 |
| Example 1 | 10 | 23 | 18 | 11-13 |
| Example 2 | 65 | 3 500 | 0.5 | 6 |
| Example 3 | 40 | 7.5 | 2.5 | >20 |
| Example 4 | 20 | 22 | 5.3 | >20 |
| Example 4 | 10 | 21 | 15 | >20 |

The observations made on scanning electron microscope cross sectional views showed that the copper seed layers obtained by implementing the method according to the invention are uniform and continuous and fully meet conformality requirements.

The results thus obtained also show that the method according to the invention makes it possible in particular to produce continuous conformal copper seed layers that may have a thickness of around 10 nm or less and exhibit excellent adhesion to diffusion barrier surfaces.

Table 1 shows in particular that the copper seed films have a sheet resistance very much lower than that of the surface of the substrate, this sheet resistance being lower the thicker the seed layer.

The copper seed layers obtained are sufficiently conducting (of sufficiently low sheet resistance) to allow subsequent filling by conventional electroplating, including when the thickness of the copper seed layer is very small, such as for example around 10 nm or less.

The measured adhesion values are at least equivalent if not better than those that would be expected by a person skilled in the art within the context of the implementation of a sputtering process.

These results therefore show that the method according to the invention clearly solves the technical problem posed.

The invention claimed is:

1. Method of coating a surface of a substrate with a seed copper layer by electroplating, wherein the surface is a copper diffusion barrier layer, the method comprising:
    a cold entry step during which the surface to be coated is brought into contact with an electroplating bath while the surface is not under electrical bias;
    a step of forming the seed copper layer during which the surface to be coated is in contact with the electroplating bath and is subjected to electrical bias for a time long enough to form the seed copper layer with a thickness of no more than 40 nm; and
    a hot exit step during which the surface is separated from the electroplating bath under electrical bias of the same sign and substantially the same electric potential level as the electrical bias during forming the seed copper layer;
    wherein the electroplating bath comprises, in solution in a solvent:
    a source of copper ions, with a concentration of between 0.4 and 18 mM; and
    at least one copper complexing agent selected from the group consisting of primary aliphatic amines, secondary aliphatic amines, tertiary aliphatic amines, aromatic amines, nitrogen heterocycles, and oximes.

2. Method according to claim 1, wherein, during the cold entry step, the surface to be coated is kept in contact with the electroplating bath for a period of at least 5 seconds.

3. Method according to claim 1, wherein the step of forming the seed copper layer is carried out by biasing in galvanostatic mode within the current range from 0.1 mA/cm$^2$ (milliamps per square centimeter) to 5 mA/cm$^2$.

4. Method according to claim 1, wherein the step of forming the seed copper layer is carried out by biasing in potentiostatic mode, imposing a cell voltage so that the resulting cell current lies within 0.1 mA/cm$^2$ to 5 mA/cm$^2$.

5. Method according to claim 1, wherein the step of forming the seed copper layer is carried out by biasing in pulsed mode, so as to impose voltage pulses corresponding to a maximum cathode current per unit area within the range from 0.1 mA/cm$^2$ to 5 mA/cm$^2$, and to a minimum cathode current per unit area within the range from 0 mA/cm$^2$ to 0.5 mA/cm$^2$.

6. Method according to claim 1, wherein, during the cold entry step, the surface to be coated is maintained in contact with the electroplating bath for a period of between 10 and 60 seconds.

7. Method according to claim 1, wherein the substrate is a silicon wafer for fabricating integrated circuits, and the surface copper diffusion barrier layer to be coated is selected from the group consisting of a bilayer based on tantalum nitride/tantalum (TaN/Ta) and tantalum nitride (TaN) layer.

8. Method according to claim 1, wherein, during the hot exit step, the surface is separated from the electroplating bath while under the bias for a period of between 1 and 10 seconds.

9. Method according to claim 1, wherein, in the electroplating bath:
    the copper ions and complexing agent(s) are present in a molar ratio of between 0.1 and 2.5; and
    the pH of the electroplating bath is less than 7.

10. Method according to claim 1, wherein, in the electroplating bath, the solvent is selected from the group consisting of water and hydroalcoholic mixtures, and the source of copper ions is a copper salt selected from the group consisting of copper sulphate, copper chlorate, copper nitrate and copper acetate.

11. Method according to claim 1, wherein, in the electroplating bath, the copper complexing agent is selected from the nitrogen heterocycles and is selected from the group consisting of pyridine, 2,2'-bipyridine, 8-hydroxyquinoline sulphonate, 1, 10-phenanthroline, 3,5-dimethylpyridine and 2,2'-bipyrimidine.

12. Method according to claim 1, wherein, in the electroplating bath, the copper complexing agent is selected from the nitrogen heterocycles and the nitrogen heterocycles include a mixture of pyridine and 2,2'-bipyridine.

13. Method according to claim 1, wherein:
    copper sulphate is selected as the source of copper ions; and
    nitrogen heterocycles in the form of a mixture of pyridine and 2,2'-bipyridine are selected as the copper complexing agents; and wherein
    the copper/complexing agents molar ratio is between 0.2 and 0.6; and
    the pH of the said electroplating bath is less than 7.

14. Method according to claim 13, wherein the molar ratio between pyridine and 2,2'-bipyridine is between 5:1 and 1:5.

15. Method according to claim 13, wherein the molar ratio between pyridine and 2,2'-bipyridine is between 3:1 and 1:1.

16. Method according to claim 1, wherein the step of forming the seed copper layer is carried out by biasing in galvanostatic mode, within the current range from 0.1 mA/cm$^2$ (milliamps per square centimeter) to 1 mA/cm$^2$.

17. Method according to claim 1, wherein the step of forming the seed copper layer is carried out by biasing in potentiostatic mode, imposing a cell voltage so that the resulting cell current lies within 0.1 mA/cm$^2$ to 1 mA/cm$^2$.

18. Method according to claim 1, wherein the step of forming the seed copper layer is carried out by biasing in pulsed mode, so as to impose voltage pulses corresponding to a maximum cathode current per unit area within the range from 0.1 mA/cm$^2$ to 1 mA/cm$^2$, and to a minimum cathode current per unit area within the range from 0 mA/cm$^2$ to 0.1 mA/cm$^2$.

19. Method according to claim 1, wherein during the cold entry step, the surface to be coated is maintained in contact with the electroplating bath for a period of between 10 and 30 seconds.

20. Method according to claim 1, wherein, during the hot exit step, the surface is separated from the electroplating bath while under the bias for a period of between 1 and 5 seconds.

21. Method according to claim 1, wherein, in the electroplating bath:
    the copper ions and the complexing agent(s) are present in a molar ratio of between 0.1 and 2.5 and
    the pH of the electroplating bath is between 3.5 and 6.5.

22. Method according to claim 1, wherein, in the electroplating bath:
    the copper ions and the complexing agent(s) are present in a molar ratio of between 0.3 and 1.3 and
    the pH of the said composition is between 3.5 and 6.5.

23. Method according to claim 1, wherein the seed copper layer has a thickness of no more than 10 nm.

24. Method according to claim 1, wherein the copper barrier diffusion layer consists essentially of at least one selected from the group consisting of tantalum, titanium nitride, tantalum nitride, tungsten nitride, tungsten carbide, and ruthenium.

25. Method according to claim 1, wherein the concentration of the source of copper ions is of between 0.4 and 15 mM.

26. Method according to claim 1, wherein the concentration of the source of copper ions is of between 0.5 and 4 mM.

27. Method according to claim 1, wherein the copper barrier diffusion layer consists essentially of at least one selected from the group consisting of tantalum and tantalum nitride.

28. Method of coating a surface of a substrate with a seed copper layer by electroplating, wherein said surface is a copper diffusion barrier layer, the method comprising:
   a cold entry step during which the surface to be coated is brought into contact with an electroplating bath while the surface is not under electrical bias;
   a step of forming the seed copper layer during which the surface to be coated is in contact with the electroplating bath and is subjected to electrical bias for a time long enough to form the seed copper layer with a thickness of no more than 40 nm; and
   a hot exit step during which the surface is separated from the electroplating bath under electrical bias of the same sign and substantially the same electric potential level as the electrical bias during the forming of the seed copper layer;
   wherein the electroplating bath comprises, in solution in a solvent:
   copper sulphate, with a concentration of between 0.4 and 18 mM; and
   a copper complexing agent which is a mixture of pyridine and 2,2'-bipyridine;
   the copper sulphate/complexing agent molar ratio being between 0.2 and 0.6; and
   the pH of the electroplating bath being between 3.5 and 6.5.

29. Method according to claim 28, wherein the copper barrier diffusion layer consists essentially of at least one selected from the group consisting of tantalum, titanium nitride, tantalum nitride, tungsten nitride, tungsten carbide, and ruthenium.

30. Method according to claim 28, wherein the step of forming the seed copper layer is subjected to electrical bias at no more than 5 mA/cm$^2$.

31. Method according to claim 28, wherein the concentration of the copper sulphate is of between 0.4 and 15 mM.

32. Method according to claim 28, wherein the molar ratio between pyridine and 2,2'-bipyridine is between 5:1 and 1:5.

* * * * *